United States Patent
Dhlamini et al.

(10) Patent No.: US 12,266,251 B1
(45) Date of Patent: Apr. 1, 2025

(54) FAULTY TRANSFORMER PARTIAL DISCHARGE, VIBRATION, COMBUSTIBLE GASES, AND SOUND FREQUENCY MONITOR AND ALARM

(71) Applicants: Sizwe Dhlamini, Reston (CA); Zijun Gong, Reston (CA); Xiaohang Zhao, Reston (CA); Huayau Rong, Reston (CA); Hnin Dhlamini, Reston (CA); Cheng Li, Reston (CA)

(72) Inventors: Sizwe Dhlamini, Reston (CA); Zijun Gong, Reston (CA); Xiaohang Zhao, Reston (CA); Huayau Rong, Reston (CA); Hnin Dhlamini, Reston (CA); Cheng Li, Reston (CA)

( * ) Notice: Subject to any disclaimer, the term of this patent is extended or adjusted under 35 U.S.C. 154(b) by 365 days.

(21) Appl. No.: 17/867,852

(22) Filed: Jul. 19, 2022

(51) Int. Cl.
*G01R 31/08* (2020.01)
*G01R 31/12* (2020.01)
*G08B 17/117* (2006.01)

(52) U.S. Cl.
CPC ........ *G08B 17/117* (2013.01); *G01R 31/1209* (2013.01); *G01R 31/1254* (2013.01)

(58) Field of Classification Search
CPC G01R 31/62; G01R 31/1209; G01R 31/1254; G01R 31/1272; G01R 31/1281; G01R 29/0878; G08B 17/117
See application file for complete search history.

(56) References Cited

U.S. PATENT DOCUMENTS

| | | | |
|---|---|---|---|
| D177,574 S | 5/1956 | Kerr | |
| 4,158,168 A | 6/1979 | Harrold | |
| 6,774,639 B1 | 8/2004 | Unsworth | |
| 7,646,308 B2 | 1/2010 | Paoletti | |
| 8,849,587 B1* | 9/2014 | Lightle | G01H 1/00 702/56 |
| 9,766,283 B2 | 9/2017 | Han | |
| 2011/0031980 A1* | 2/2011 | Kruger | G01R 31/62 324/547 |
| 2011/0055669 A1* | 3/2011 | DeHaan | G06F 11/3072 714/799 |
| 2012/0092114 A1* | 4/2012 | Matthews | H01F 27/402 336/107 |
| 2014/0049264 A1 | 2/2014 | Ganesh | |
| 2014/0297206 A1 | 10/2014 | Silverman | |
| 2020/0393521 A1* | 12/2020 | Bayoumi | G01R 31/62 |

FOREIGN PATENT DOCUMENTS

| | | | |
|---|---|---|---|
| CN | 110595609 | * | 12/2019 |
| CN | 110873604 | * | 3/2020 |
| JP | 2020008365 | * | 1/2020 |
| KR | 102264773 | * | 6/2021 |
| WO | 2017146877 | | 8/2017 |

* cited by examiner

*Primary Examiner* — Thang X Le

(57) ABSTRACT

The faulty transformer partial discharge, vibration, combustible gases, and sound frequency monitor and alarm is an electric circuit. The faulty transformer partial discharge, vibration, combustible gases, and sound frequency monitor and alarm is a diagnostic tool. The faulty transformer partial discharge, vibration, combustible gases, and sound frequency monitor and alarm comprises a control circuit, a housing structure, and a transformer structure. The housing structure contains the control circuit. The housing structure attaches the control circuit to the transformer structure. The control circuit captures audible sounds generated by the transformer structure. The control circuit analyzes the captured audible sounds.

10 Claims, 4 Drawing Sheets

FAULTY TRANSFORMER PARTIAL DISCHARGE, VIBRATION, COMBUSTIBLE GASES, AND SOUND FREQUENCY MONITOR AND ALARM

CROSS REFERENCES TO RELATED APPLICATIONS

Not Applicable

STATEMENT REGARDING FEDERALLY SPONSORED RESEARCH

Not Applicable

REFERENCE TO APPENDIX

Not Applicable

BACKGROUND OF THE INVENTION

Field of the Invention

The present invention relates to the field of circuit arrangements specially adapted for detecting undesired changes from normal working conditions for transformers. (H02H7/042)

SUMMARY OF INVENTION

The faulty transformer partial discharge, vibration, combustible gases, and sound frequency monitor and alarm is an electric circuit. The faulty transformer partial discharge, vibration, combustible gases, and sound frequency monitor and alarm is a diagnostic tool. The faulty transformer partial discharge, vibration, combustible gases, and sound frequency monitor and alarm comprises a control circuit, a housing structure, and a transformer structure. The housing structure contains the control circuit. The housing structure attaches the control circuit to the transformer structure. The control circuit captures audible sounds generated by the transformer structure. The control circuit analyzes the captured audible sounds. If the control circuit detects that one or more captured audible sounds are being generated at a frequency known to indicate an abnormal operating condition for the transformer structure, the control circuit transmits a messaging facility to a remote monitoring station.

These together with additional objects, features and advantages of the faulty transformer partial discharge, vibration, combustible gases, and sound frequency monitor and alarm will be readily apparent to those of ordinary skill in the art upon reading the following detailed description of the presently preferred, but nonetheless illustrative, embodiments when taken in conjunction with the accompanying drawings.

In this respect, before explaining the current embodiments of the faulty transformer partial discharge, vibration, combustible gases, and sound frequency monitor and alarm in detail, it is to be understood that the faulty transformer partial discharge, vibration, combustible gases, and sound frequency monitor and alarm is not limited in its applications to the details of construction and arrangements of the components set forth in the following description or illustration. Those skilled in the art will appreciate that the concept of this disclosure may be readily utilized as a basis for the design of other structures, methods, and systems for carrying out the several purposes of the faulty transformer partial discharge, vibration, combustible gases, and sound frequency monitor and alarm.

It is therefore important that the claims be regarded as including such equivalent construction insofar as they do not depart from the spirit and scope of the faulty transformer partial discharge, vibration, combustible gases, and sound frequency monitor and alarm. It is also to be understood that the phraseology and terminology employed herein are for purposes of description and should not be regarded as limiting.

BRIEF DESCRIPTION OF DRAWINGS

The accompanying drawings, which are included to provide a further understanding of the invention are incorporated in and constitute a part of this specification, illustrate an embodiment of the invention and together with the description serve to explain the principles of the invention. They are meant to be exemplary illustrations provided to enable persons skilled in the art to practice the disclosure and are not intended to limit the scope of the appended claims.

DETAILED DESCRIPTION OF THE EMBODIMENT

The following detailed description is merely exemplary in nature and is not intended to limit the described embodiments of the application and uses of the described embodiments. As used herein, the word "exemplary" or "illustrative" means "serving as an example, instance, or illustration." Any implementation described herein as "exemplary" or "illustrative" is not necessarily to be construed as preferred or advantageous over other implementations. All of the implementations described below are exemplary implementations provided to enable persons skilled in the art to practice the disclosure and are not intended to limit the scope of the appended claims. Furthermore, there is no intention to be bound by any expressed or implied theory presented in the preceding technical field, background, brief summary or the following detailed description.

Figure 1:
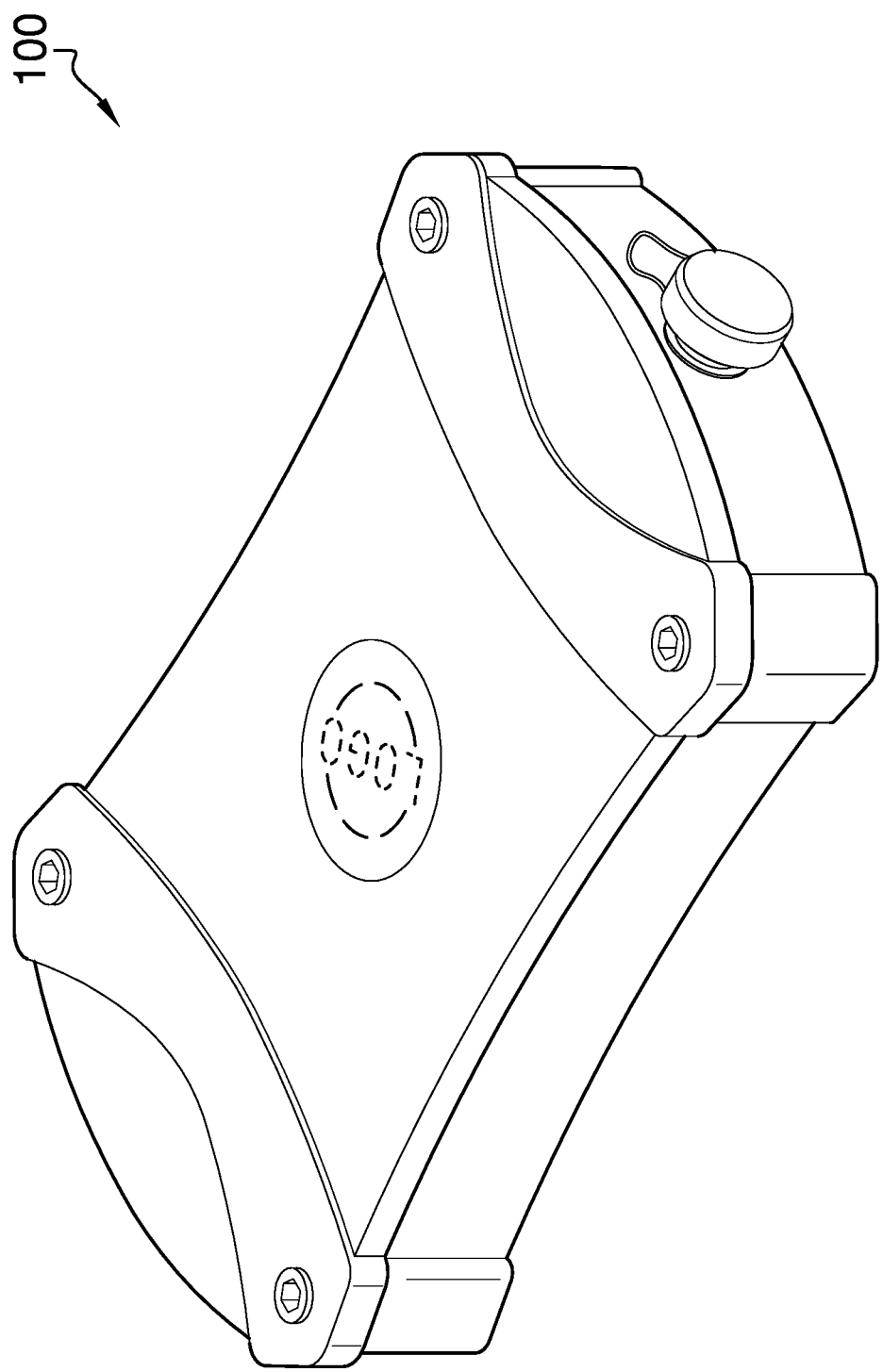
FIG. 1 is a perspective view of an embodiment of the disclosure.
Figure 2:
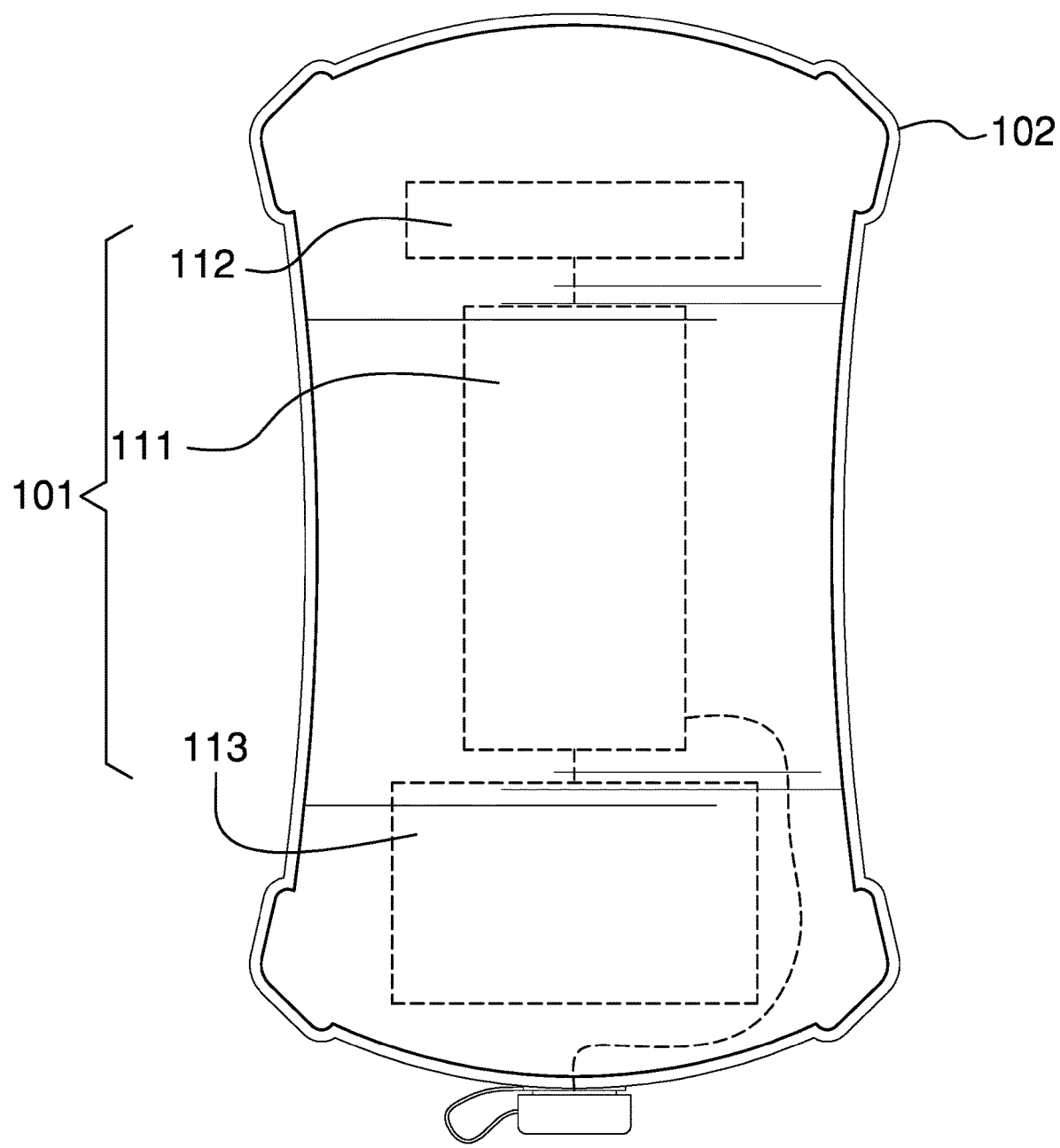
FIG. 2 is a bottom view of an embodiment of the disclosure.
Figure 3:
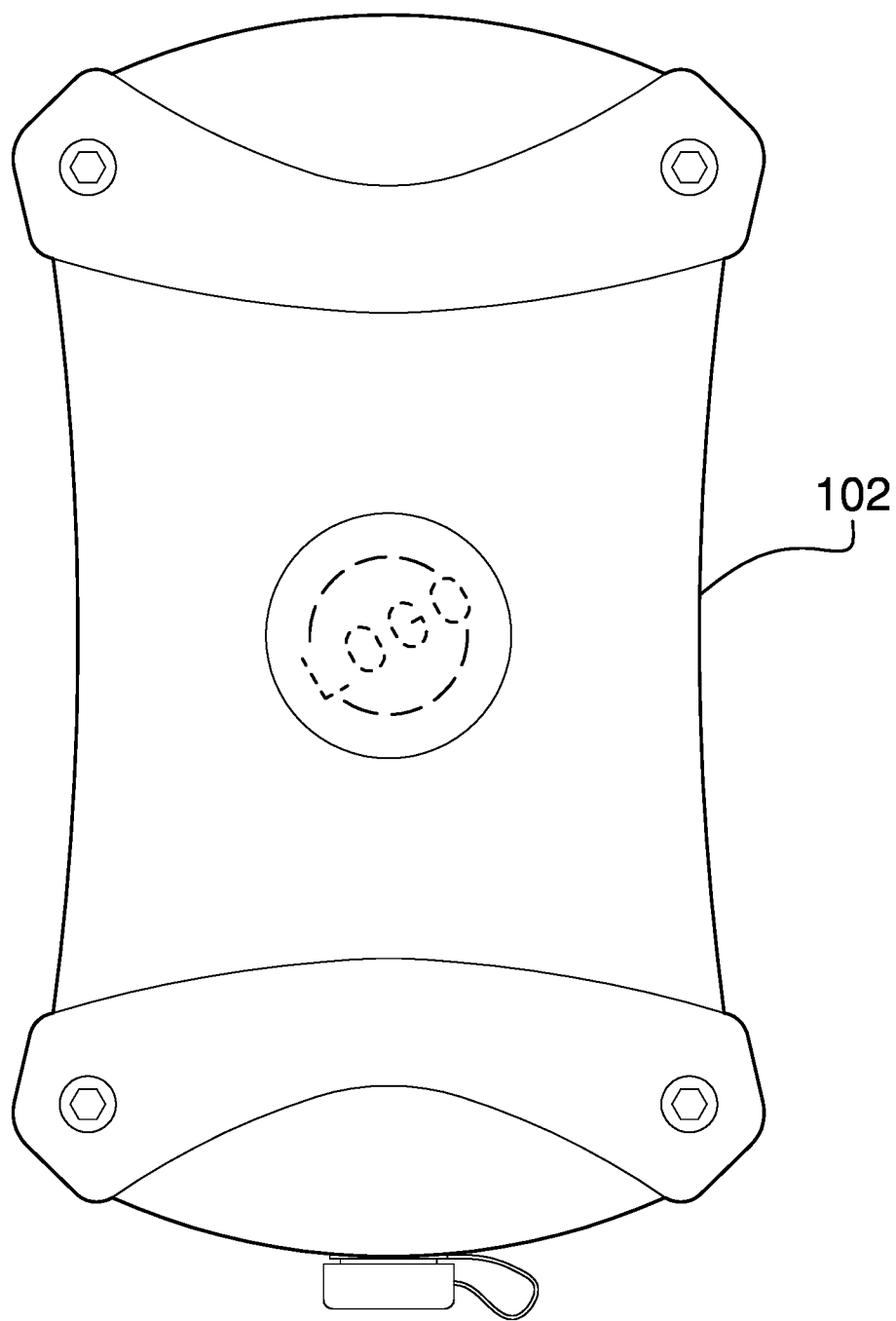
FIG. 3 is a top view of an embodiment of the disclosure.
Figure 4:
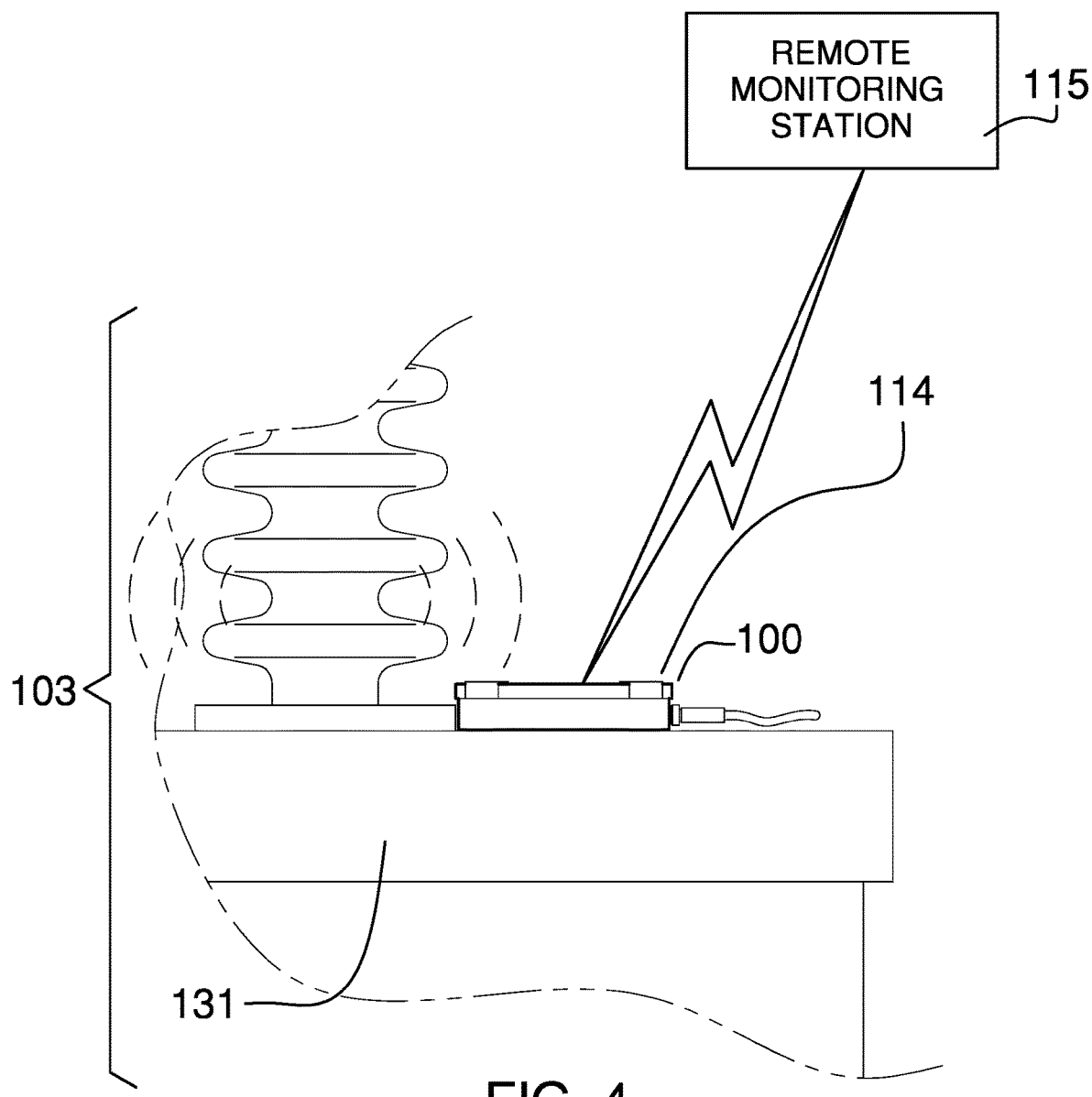
FIG. 4 is an in-use view of an embodiment of the disclosure.

Detailed reference will now be made to one or more potential embodiments of the disclosure, which are illustrated in FIGS. 1 through 5.

The faulty transformer partial discharge, vibration, combustible gases, and sound frequency monitor and alarm 100 (hereinafter invention) is an electric circuit. The invention 100 is a diagnostic tool. The invention 100 comprises a control circuit 101, a housing structure 102, and a transformer structure 103. The housing structure 102 contains the control circuit 101. The housing structure 102 attaches the control circuit 101 to the transformer structure 103. The control circuit 101 captures audible sounds generated by the transformer structure 103. The control circuit 101 analyzes the captured audible sounds. If the control circuit 101 detects that one or more captured audible sounds are being generated at a frequency known to indicate an abnormal operating condition for the transformer structure 103, the control circuit 101 transmits a messaging facility to a remote monitoring station 115.

The transformer structure 103 is an electric circuit. The transformer structure 103 is an inductive circuit. The transformer structure 103 is an electric device used to change the voltage presented by an ac electric current. The transformer structure 103 further comprises a pedestal structure 131. The pedestal structure 131 is a rigid structure. The pedestal structure 131 forms a pedestal that supports the transformer structure 103. The housing structure 102 mounts on the pedestal structure 131 when the control circuit 101 is intended to pick up non-audible vibrations from the transformer structure 103.

The housing structure 102 is a rigid structure. The housing structure 102 contains the control circuit 101. The housing structure 102 is formed with all apertures and form factors necessary to allow the housing structure 102 to accommodate the use and operation of the control circuit 101. Methods to form a housing structure 102 suitable for the purposes described in this disclosure are well-known and documented in the mechanical arts.

The control circuit 101 is an electric circuit. The control circuit 101 monitors the transformer structure 103 for a stimulus selected from the group consisting of: a) an audible sound; and, b) a vibration. The control circuit 101 captures the selected stimulus (hereinafter an audible sound). The control circuit 101 analyzes the frequency distribution of the captured audible sound. The control circuit 101 determines if a frequency detected by the control circuit 101 is consistent with a known abnormal operating condition of the transformer structure 103. If the control circuit 101 determines that the transformer structure 103 is operating under abnormal operating conditions, the logic module 111 generates and transmits a message facility to the remote monitoring station 115 informing the remote monitoring station 115 about the abnormal operating condition.

The control circuit 101 comprises a logic module 111, a communication module 112, and a vibration sensor 113. The logic module 111, the communication module 112, and the vibration sensor 113 are electrically interconnected. The communication module 112 further comprises a wireless communication link 114 and a remote monitoring station 115. The communication module 112 forms the wireless communication link 114 between the logic module 111 and a remote monitoring station 115.

The logic module 111 is a readily and commercially available programmable electronic device that is used to manage, regulate, and operate the control circuit 101. Depending on the specific design and the selected components, the logic module can be a separate component within the control circuit 101 or the functions of the logic module 111 can be incorporated into another component within the control circuit 101. The communication module 112 is a wireless electronic communication device that allows the logic module 111 to wirelessly communicate with a remote monitoring station 115. The communication module 112 sends a direct messaging facility 115 that is transmitted over the wireless communication link 114 to the remote monitoring station. The message contained in the direct messaging facility 115 contains the identification of the transformer structure 103 and a summary of the abnormal operating condition identified by the logic module.

In the first potential embodiment of the disclosure, the communication module 112 communicates SMS and MMS messages between the logic module 121 and the direct messaging facility 115 through a commercially provided and publicly available cellular wireless network. The use of a commercially provided and publicly available cellular wireless network is preferred because: a) of its low cost; b) of the widespread availability and the broad interoperability between competing commercially provided and publicly available cellular wireless networks; and, c) methods and techniques to send SMS and MMS messages over a commercially provided and publicly available cellular wireless network are well known and documented by those skilled in the electrical arts.

The vibration sensor 113 is a sensor. The vibration sensor 113 is a transducer. The vibration sensor 113 electrically connects to the logic module 111. The logic module 111 monitors the operation of the vibration sensor 113. The vibration sensor detects the vibrations of an audible sound. The vibration sensor 113 converts the detected vibrations into an electric signal. The vibration sensor 113 transmits the electric signal to the logic module 111 for further processing. In the first potential embodiment of the disclosure, the vibration sensor 113 is selected from the group consisting of a microphone and a piezoelectric device.

The logic module 111 analyzes the frequency distribution of the captured audible sound received from the vibration sensor 113. The logic module 111 determines if a frequency detected by the vibration sensor 113 is consistent with a known abnormal operating condition of the transformer structure 103. If the logic module 111 determines that the transformer structure 103 is operating under abnormal operating conditions, the logic module 111 generates and transmits a message facility to the remote monitoring station 115 informing the remote monitoring station 115 about the abnormal operating condition. The logic module 111 transmits a message facility to the remote monitoring station 115 through the communication module 112 and the wireless communication link 114.

The remote monitoring station 115 is a appropriate authority. The remote monitoring station 115 is an organization who is designated to receive the messaging facility.

The following definitions were used in this disclosure:

AC: As used in this disclosure, AC is an acronym for alternating current.

Appropriate Authority: As used in this disclosure, an appropriate authority is a previously determined person or organization that is designated to send and receive alarm or other notification messages regarding a monitored system or activity.

Commercially Provided and Publicly Available Cellular Wireless Network: As used in this disclosure, a commercially provided and publicly available cellular wireless network refers to subscription based publicly available wireless network commonly used to provide wireless communication access for personal data devices. The commercially provided and publicly available cellular wireless network will typically provide voice communication, data communication services, and SMS and MMS messaging services. The commercially provided and publicly available cellular wireless network is commonly referred to as the cellular network. The commercially provided and publicly available cellular wireless network is abbreviated as the PPWN.

Communication Link: As used in this disclosure, a communication link refers to the structured exchange of data between two objects.

Email: As used in this disclosure, email describes a communication between a sender and one or more receivers that is delivered through a network wherein the nodes of the network comprise a plurality of logical devices. An email will generally comprise a text based communication component.

Form Factor: As used in this disclosure, the term form factor refers to the size and shape of an object.

Induction: As used in this disclosure, induction refers to a process where a first process selected from the group consisting of an electric current or an electromagnetic field generates or interacts with a second process selected from the group consisting of an electric current or an electromagnetic field.

Induction Circuit: As used in this disclosure, an induction circuit is a first electric circuit, or sub-circuit, that is inductively coupled with a second electric circuit.

Messaging Facility: As used in this disclosure, a messaging facility a messaging facility is a previously determined formatting structure through which a text or image (referred to in this definition as text) based communication is transmitted for delivery. A messaging facility is selected from the group consisting of a traditional messaging facility, a direct messaging facility and a broadcast messaging facility. A traditional messaging facility includes the delivery of a physical object containing the text based communication. The direct messaging facility includes communications that are addressed to a previously identified group of recipients. The broadcast messaging facility includes communications that are transmitted without the prior identification of the intended group of recipients. An example of a traditional messaging facility includes, but are not limited to, postal delivery. Examples of a direct messaging facilities include, but are not limited to, email and SMS messages. A social media service is an example of a broadcast messaging facility.

Housing: As used in this disclosure, a housing is a rigid structure that encloses and protects one or more devices.

Logic Module: As used in this disclosure, a logic module is a readily and commercially available electrical device that accepts digital and analog inputs, processes the digital and analog inputs according to previously specified logical processes and provides the results of these previously specified logical processes as digital or analog outputs. The disclosure allows, but does not assume, that the logic module is programmable.

Microphone: As used in this disclosure, a microphone is a transducer that converts the energy from vibration into electrical energy. The sources of vibrations include, but are not limited to, acoustic energy.

Piezoelectric Effect: As used in this disclosure, the piezoelectric effect refers to a class of materials wherein a strain placed upon the material will result in a redistribution of electrons within the material in a manner that causes an electric charge. This electric charge can be measured as a voltage potential across the material. This effect can be reversed in some of these materials such that the application of an AC voltage to the material will cause a vibration within the material. A material commonly used to take advantage of the piezoelectric effect is polyvinylidene difluoride (CAS 24937-79-9) which is also known as PVDF.

PPWN: As used in this disclosure, the PPWN is an acronym for publicly provided wireless network. The PPWN refers to a commercially provided and publicly available cellular wireless network.

Rigid Structure: As used in this disclosure, a rigid structure is a solid structure formed from an inelastic material that resists changes in shape. A rigid structure will permanently deform as it fails under a force. See bimodal flexible structure.

Sensor: As used in this disclosure, a sensor is a device that receives and responds in a predetermined way to a signal or stimulus. As further used in this disclosure, a threshold sensor is a sensor that generates a signal that indicates whether the signal or stimulus is above or below a given threshold for the signal or stimulus.

SMS: As used in this disclosure, SMS is an abbreviation for short message service. The short message service is a service that is often provided with the cellular services that support personal data devices. Specifically, the SMS allows for the exchange of written messages between personal data devices. The SMS is commonly referred to as text messaging. A common enhancement of SMS is the inclusion of the delivery of multimedia services. This enhanced service is often referred to as Multimedia Media Services which is abbreviated as MMS.

Speaker: As used in this disclosure, a speaker is an electrical transducer that converts an electrical signal into an audible sound.

Subscription: As used in this disclosure, a subscription refers to a contractual arrangement for the delivery of a product or access to a service on a recurring basis. The subscribed product or service can be provided on a continuous basis or on a scheduled basis. The term subscription often implies that the subscribed product or service has been paid for in advance.

Transducer: As used in this disclosure, a transducer is a device that converts a physical quantity, such as pressure or brightness into an electrical signal or a device that converts an electrical signal into a physical quantity.

Transformer: As used in this disclosure, the transformer is an electrical device. The transformer forms an inductive circuit that is used to change a first ac voltage to a second ac voltage. Use Induction, induction circuit and ac.

WiFi™: As used in this disclosure, WiFi™ refers to the physical implementation of a collection of wireless electronic communication standards commonly referred to as IEEE 802.11x.

Wireless: As used in this disclosure, wireless is an adjective that is used to describe a communication link between two devices that does not require the use of physical cabling.

With respect to the above description, it is to be realized that the optimum dimensional relationship for the various components of the invention described above and in FIGS. 1 through 4 include variations in size, materials, shape, form, function, and manner of operation, assembly and use, are deemed readily apparent and obvious to one skilled in the art, and all equivalent relationships to those illustrated in the drawings and described in the specification are intended to be encompassed by the invention.

It shall be noted that those skilled in the art will readily recognize numerous adaptations and modifications which can be made to the various embodiments of the present invention which will result in an improved invention, yet all of which will fall within the spirit and scope of the present invention as defined in the following claims. Accordingly, the invention is to be limited only by the scope of the following claims and their equivalents.

The inventor claims:

1. A faulty transformer monitor and alarm comprising
a control circuit, a housing structure, and a transformer structure;
wherein the housing structure attaches the control circuit to the transformer structure;
wherein the faulty transformer monitor and alarm is a diagnostic tool;

wherein the control circuit captures a stimulus generated by the transformer structure;
wherein the control circuit analyzes the captured audible stimulus;
wherein if the control circuit detects that the captured stimulus is being generated at a frequency known to indicate an abnormal operating condition for the transformer structure, the control circuit transmits a messaging facility to a remote monitoring station;
wherein the control circuit comprises a logic module, a communication module, and a vibration sensor;
wherein the logic module is a readily and commercially available programmable electronic device that is used to manage, regulate, and operate the control circuit;
wherein the communication module is a wireless electronic communication device;
wherein the communication module sends a direct messaging facility that is transmitted over the wireless communication link to the remote monitoring station;
wherein the message contained in the direct messaging facility contains the identification of the transformer structure and a summary of the abnormal operating condition identified by the logic module.

2. The faulty transformer monitor and alarm according to claim 1
wherein the transformer structure is an electric circuit;
wherein the transformer structure is an inductive circuit.

3. The faulty transformer monitor and alarm according to claim 2
wherein the housing structure contains the control circuit;
wherein the housing structure is a rigid structure.

4. The faulty transformer monitor and alarm according to claim 3
wherein the control circuit is an electric circuit;
wherein the control circuit monitors the transformer structure for the stimulus;
wherein the stimulus is selected from the group consisting of: a) an audible sound; and, b) a vibration.

5. The faulty transformer monitor and alarm according to claim 4
wherein the control circuit analyzes the frequency distribution of the captured audible sound;
wherein the control circuit determines if a frequency detected by the control circuit is consistent with a known abnormal operating condition of the transformer structure;
wherein if the control circuit determines that the transformer structure is operating under abnormal operating conditions, the logic module generates and transmits the message facility to the remote monitoring station informing the remote monitoring station about the abnormal operating condition.

6. The faulty transformer monitor and alarm according to claim 5
wherein the logic module, the communication module, and the vibration sensor are electrically interconnected;
wherein the communication module further comprises a wireless communication link;
wherein the communication module forms the wireless communication link between the logic module and the remote monitoring station.

7. The faulty transformer monitor and alarm according to claim 6
wherein the vibration sensor is a transducer;
wherein the vibration sensor electrically connects to the logic module.

8. The faulty transformer monitor and alarm according to claim 7
wherein the logic module monitors the operation of the vibration sensor;
wherein the vibration sensor detects the vibrations of an audible sound;
wherein the vibration sensor converts the detected vibrations into an electric signal;
wherein the vibration sensor transmits the electric signal to the logic module for further processing.

9. The faulty transformer monitor and alarm according to claim 8
wherein the logic module analyzes the frequency distribution of the captured audible sound received from the vibration sensor;
wherein the logic module determines if a frequency detected by the vibration sensor is consistent with a known abnormal operating condition of the transformer structure;
wherein if the logic module determines that the transformer structure is operating under abnormal operating conditions, the logic module generates and transmits a message facility to the remote monitoring station informing the remote monitoring station about the abnormal operating condition.

10. The faulty transformer monitor and alarm according to claim 9
wherein the transformer structure further comprises a pedestal structure;
wherein the pedestal structure is a rigid structure;
wherein the pedestal structure forms a pedestal that supports the transformer structure;
wherein the housing structure mounts on the pedestal.

* * * * *